United States Patent
Nakagawa et al.

(10) Patent No.: US 7,444,168 B2
(45) Date of Patent: Oct. 28, 2008

(54) RADIO COMMUNICATION SEMICONDUCTOR INTEGRATED CIRCUIT, DATA PROCESSING SEMICONDUCTOR INTEGRATED CIRCUIT AND PORTABLE DEVICE

(75) Inventors: Tetsuya Nakagawa, Koganei (JP); Masafumi Kunori, Higashimurayama (JP)

(73) Assignee: Renesas Technology Corp., Tokyo (JP)

( * ) Notice: Subject to any disclaimer, the term of this patent is extended or adjusted under 35 U.S.C. 154(b) by 866 days.

(21) Appl. No.: 10/948,138

(22) Filed: Sep. 24, 2004

(65) Prior Publication Data
US 2005/0094530 A1    May 5, 2005

(30) Foreign Application Priority Data
Oct. 29, 2003  (JP)  ............................. 2003-368682

(51) Int. Cl.
*H04B 1/38* (2006.01)
*H04M 1/00* (2006.01)

(52) U.S. Cl. ...................... 455/557; 455/556.1; 455/68; 455/69; 455/70; 455/71; 455/418; 455/420; 370/395.62

(58) Field of Classification Search .......... 455/556.1–2, 455/557, 558, 68–71, 500, 502, 418, 420, 455/323, 333; 375/219, 220, 354–355, 358–359, 375/371–372, 376; 370/395.62, 516, 518–520
See application file for complete search history.

(56) References Cited

U.S. PATENT DOCUMENTS

| | | | |
|---|---|---|---|
| 5,821,987 A | 10/1998 | Larson et al. | 348/19 |
| 5,982,459 A | 11/1999 | Fandrianto et al. | 348/845 |
| 6,125,139 A * | 9/2000 | Hendrickson et al. | 375/220 |
| 2004/0204096 A1* | 10/2004 | Hirsch et al. | 455/561 |
| 2004/0242183 A1* | 12/2004 | Sugar et al. | 455/333 |

* cited by examiner

*Primary Examiner*—Tuan A Tran
(74) *Attorney, Agent, or Firm*—Mattingly, Stanger, Malur & Brundidge, P.C.

(57) ABSTRACT

A portable device having a communication function composed of a plurality of LSIs operated in synchronization with a clock, such as a baseband LSI and a logic LSI such as an application processor, can synchronize the baseband LSI with the logic LSI without lowering the performance of the logic LSI.

4 Claims, 9 Drawing Sheets

RADIO COMMUNICATION SEMICONDUCTOR INTEGRATED CIRCUIT, DATA PROCESSING SEMICONDUCTOR INTEGRATED CIRCUIT AND PORTABLE DEVICE

BACKGROUND OF THE INVENTION

The present invention relates to a technique effective to be applied to a clock synchronization technique in a communication system, further in the case of synchronizing two or more semiconductor integrated circuits operated by different clock signals, respectively. For instance, the present invention relates to a technique effective to be used in a portable phone including an LSI (baseband LSI) performing modulation and demodulation processing of voice data and a logic LSI (application processor) compressing and decompressing voice data.

In recent years, portable phones having a videophone function have been developed. A portable phone having a videophone function has a baseband LSI performing baseband processing such as modulation and demodulation of voice data, a logic LSI called an application processor compressing and decompressing voice data and moving image data, and a radiofrequency LSI performing up-convert of a transmission signal and down-convert of a reception signal.

In the case of performing communication between portable phones, they must be synchronized with each other. A portable phone is operated by a clock signal (hereinafter, simply called a clock) generated by its own oscillator. Due to a variation in frequency of the respective oscillators and a frequency drift with temperature change, a clock frequency is different in each portable phone. The Doppler shift by fast movement of the user of a portable phone causes a difference between clocks. Correct synchronization cannot be obtained. Accordingly, in a portable phone system, each of portable phones has an AFC (Automatic Frequency Correction) function correcting a clock frequency of the portable phone based on time information of a master clock of a base station included in data received from the base station to the portable phone, ensuring synchronization between the portable phones.

SUMMARY OF THE INVENTION

As shown in FIG. 9, a portable phone having a videophone function has a baseband LSI 100, a radiofrequency LSI 200, and an application processor 300. The baseband LSI 100 generates an internal clock CLK1 having a frequency obtained by multiplying a clock $\phi 0$ of 13 MHz or 26 MHz from an oscillator 230 incorporated in the radiofrequency LSI 230 as a reference clock by a PLL circuit, to operate a CPU 110 in synchronization with this. The application processor 300 generates an internal clock CLK2 having a frequency obtained by multiplying a clock $\phi 1$ from its own oscillator as a reference clock by a PLL circuit to operate a CPU 310 in synchronization with this. A clock CLK3 obtained by frequency dividing it operates a peripheral circuit such as a timer counter.

The operation of the baseband LSI is synchronized with a master clock of a base station. However, the operation of the baseband LSI is not synchronized with the operation of the application processor. In the case of transmitting and receiving voice data and moving image data between portable devices, data exceeding the processing ability of the portable device of the party on one end is transmitted when a clock frequency of the portable device of the party on the other end is higher. In the processing while storing received data in a buffer, the buffer is overflowed after a long period of time elapses. The normal reception state cannot be maintained.

In order to synchronize the operation of the baseband LSI with the operation of the application processor, it can be considered that, as in the baseband LSI, the application processor generates an internal clock having a frequency obtained by multiplying the clock $\phi 0$ from the oscillator incorporated in the radiofrequency LSI as a reference clock by the PLL circuit for operation. The frequency of the internal clock of the application processor is limited to an integral multiple (a power of 2) of the clock $\phi 0$ of the oscillator incorporated in the radiofrequency LSI. In the case that the maximum frequency is not an integral multiple of the clock $\phi 0$, the CPU must be operated at a frequency lower than that. The performance of the application processor cannot be satisfactorily exerted.

An object of the present invention is to provide a portable device having a communication function composed of a plurality of LSIs operated in synchronization with clocks, such as a baseband LSI and a logic LSI such as an application processor, which can synchronize the baseband LSI with the logic LSI without lowering the performance of the logic LSI.

Another object of the present invention is to provide a portable device which can maintain the normal reception state over a long period of time. The above and other objects and novel features of the present invention will be apparent from the description of this specification and the attached drawings.

The description of the representative invention disclosed in the present invention is as follows.

In a portable device having a communication function composed of a plurality of LSIs respectively operated in synchronization with different clocks, such as a radio communication semiconductor integrated circuit (baseband LSI) performing processing of modulating transmitted data and demodulating received data and a data processing semiconductor integrated circuit (application processor) performing processing of compressing transmitted data and decompressing received data, the baseband LSI has a function of detecting a frequency drift of a clock signal based on time information for synchronization included in the received data and a terminal or an interface for outputting a signal including its own time information to the outside, and the application processor performing compression processing of data to be transmitted and decompression processing of received data has a terminal or an interface for inputting a signal including time information from the outside, and the signal including time information is fed from the baseband LSI to the application processor. As the signal including time information, there are the clock signal, a signal periodically generated by a timer, and a text signal and a binary code signal indicating time. Any one of the signals may be used.

According to the above-described means, the application processor which has received a signal including time information corrects time of the timer in its own chip so as to be matched with time information received from the baseband LSI, thereby synchronizing the baseband LSI with the application processor. The baseband LSI has a function of matching its own clock with a master clock included in received data from a base station. The operation of the application processor can be also synchronized with the master clock. The timer on the application processor side may be a timer counter composed of hardware or a software timer provided in a RAM (random access memory) and updated by a program.

In the case that the application processor has a function of DMA transferring sampled voice data or image data, the number of the DMA transferred voice data or image data may be reset based on a difference between time information fed from the baseband LSI to the application processor and time information of the timer on the application processor side. For the processing of transmitted data and received data, the time of the baseband LSI can be synchronized with the time of the application processor.

An effect obtained by the representative invention disclosed in the present invention will be briefly described as follows.

A portable device having a communication function composed of a plurality of LSIs operated in synchronization with clocks, such as a baseband LSI and a logic LSI such as an application processor, can synchronize the baseband LSI with the logic LSI without lowering the performance of the logic LSI. A portable device which can maintain the normal reception state over a long period of time can be realized.

DETAILED DESCRIPTION OF THE PREFERRED EMBODIMENTS

Preferred embodiments of the present invention will be described below based on the drawings.

Embodiment 1

Figure 1:
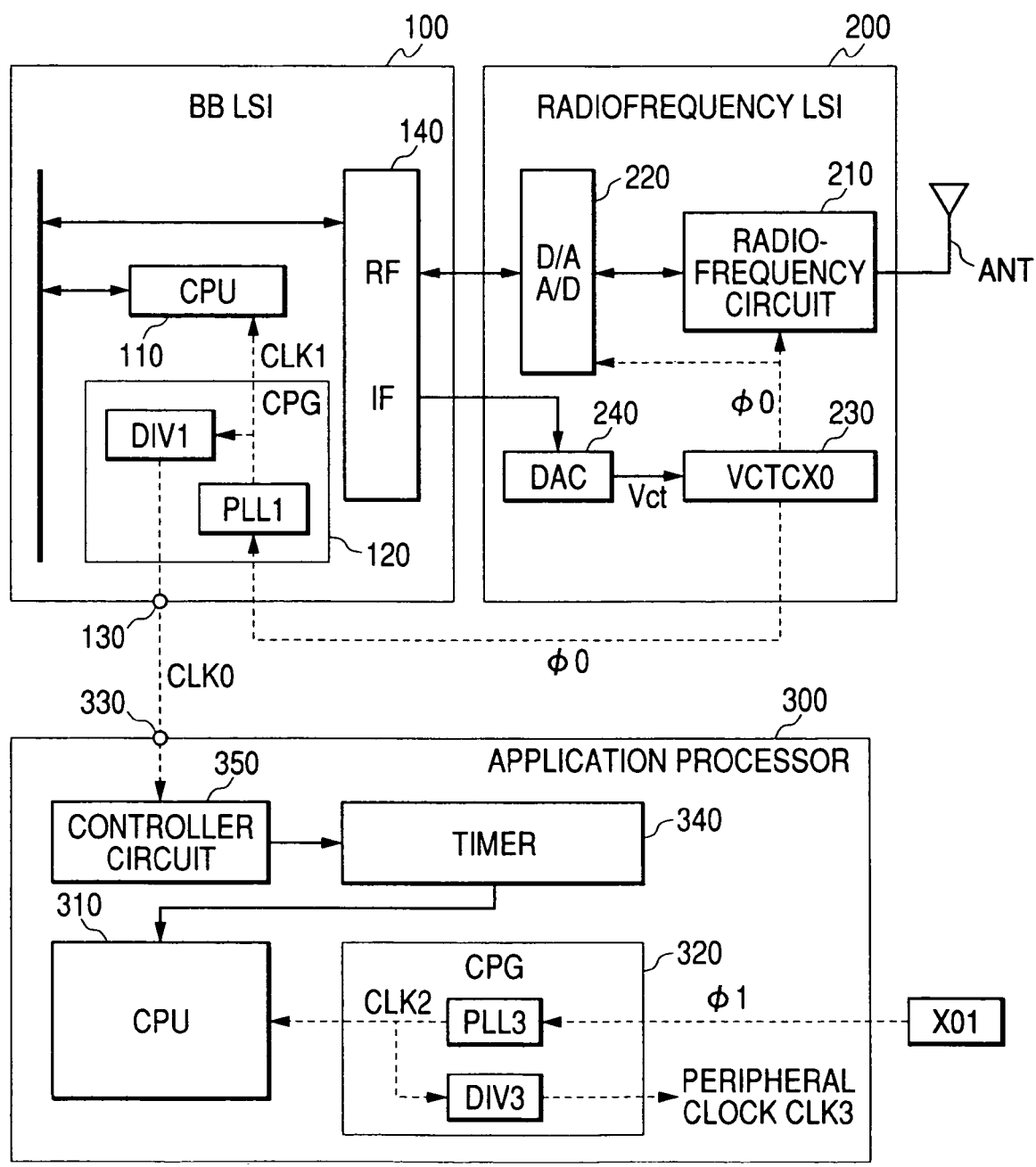
FIG. 1 is a block diagram showing a first embodiment in which the present invention is applied to a portable device, such as a portable phone, having a radio communication function.

FIG. 1 shows a first embodiment in which the present invention is applied to a portable device, such as a portable phone, having a radio communication function. A portable device of this embodiment has a baseband LSI 100 performing processing of modulating transmitted data and demodulating received data, a radiofrequency LSI 200 performing up-convert of a transmission signal and down-convert of a reception signal, and an application processor 300 as a logic LSI decompressing and compressing voice data or moving image data.

The radiofrequency LSI 200 has a radiofrequency circuit 210 performing up-convert of a transmission signal and down-convert of a reception signal and amplifying a signal, a D/A and A/D converter circuit 220 converting transmitted data to an analog signal and converting a reception signal to a digital signal, a voltage-controlled oscillator circuit 230 generating a clock $\phi 0$ fed to the radiofrequency circuit 210 for frequency converting a transmission signal or a reception signal and operating the D/A and A/D converter circuit 220, and a DA converter circuit 240 giving an oscillation control voltage Vct to the oscillator circuit 230 based on controlled data from the outside of the chip. The radiofrequency circuit 210 is provided with a PLL circuit generating a clock having a radiofrequency obtained by multiplying the clock $\phi 0$ from the voltage-controlled oscillator circuit 230 as a reference clock.

The baseband LSI 100 has a CPU 110 performing modulation and demodulation processing and control of the entire chip, a clock generator circuit (CPG) 120 having a PLL circuit PLL1 generating an internal clock CLK1 obtained by multiplying a clock signal fed from the outside of the chip and a divider circuit DIV1 frequency dividing the clock CLK1 generated by the PLL to generate an operation clock of a peripheral circuit, a clock output terminal 130 for outputting a clock CLK0 frequency divided by the divider circuit DIV1 to the outside of the chip, and an RF interface transmitting and receiving transmitted and received data between the baseband LSI 100 and the radiofrequency LSI 200. In this embodiment, the clock $\phi 0$ from the oscillator circuit 230 of the radiofrequency LSI 200 is inputted as a reference clock to the baseband LSI 100. The oscillator circuit 230 may be an external oscillator.

The baseband LSI 100 has an AFC function generating data detecting a difference between two clocks from the frequency of the internal clock CLK1 generated based on the reference clock $\phi 0$ from the radiofrequency LSI 200 and information on a master clock included in received data from a base station and correcting the difference. The AFC function is realized by software processing of the CPU 110.

Corrected data generated by the AFC function is fed via the RF interface 140 to the DA converter circuit 240 of the radiofrequency LSI 200 to be converted to an analog signal. The signal is applied as the oscillation control voltage Vct to the oscillator circuit 230 to correct the frequency of the reference clock $\phi 0$.

The application processor 300 comprises a CPU 310 performing software processing of compression and decompression of voice data or image data, a clock generator circuit 320 having a PLL circuit PLL3 generating an internal clock CLK2 obtained by multiplying a clock signal φ1 from an oscillator XO1 externally provided to the external terminal of the chip and a divider circuit DIV3 frequency dividing the clock CLK2 generated by the PLL to generate an operation clock CLK3 of the peripheral circuit, a clock input terminal 330 for inputting the clock CLK0 outputted from the baseband LSI 100, a timer 340 count operated based on a clock from the baseband LSI 100, and a controller circuit 350 operating the timer 340 upon reception of the clock CLK0 inputted from the clock input terminal 330. The controller circuit 350 has a function of resetting the timer 340 at power-up or suitable timing and reading a value of the timer 340. The controller circuit 350 may be a simple buffer without any complicated functions which converts a signal from the outside to a signal of amplitude suitable to the inside of the chip.

The CPU 310 is operated by the internal clock CLK2 generated based on the clock signal φ1 of the oscillator XO1 and can detect a difference between the clock CLK0 (CLK1) of the baseband LSI 100 and the clock CLK2 of the application processor 300 by referring to a value of the timer 340 count operated based on the clock CLK0 from the baseband LSI 100. The processing operation on the application processor side, such as image data compression processing, can be synchronized with the processing operation on the baseband LSI 100 side. The internal clocks CLK1 and CLK2 have a frequency of hundreds of MHz, respectively. The oscillator XO1 has a crystal oscillator circuit with a high accuracy.

Embodiment 2

Figure 2:
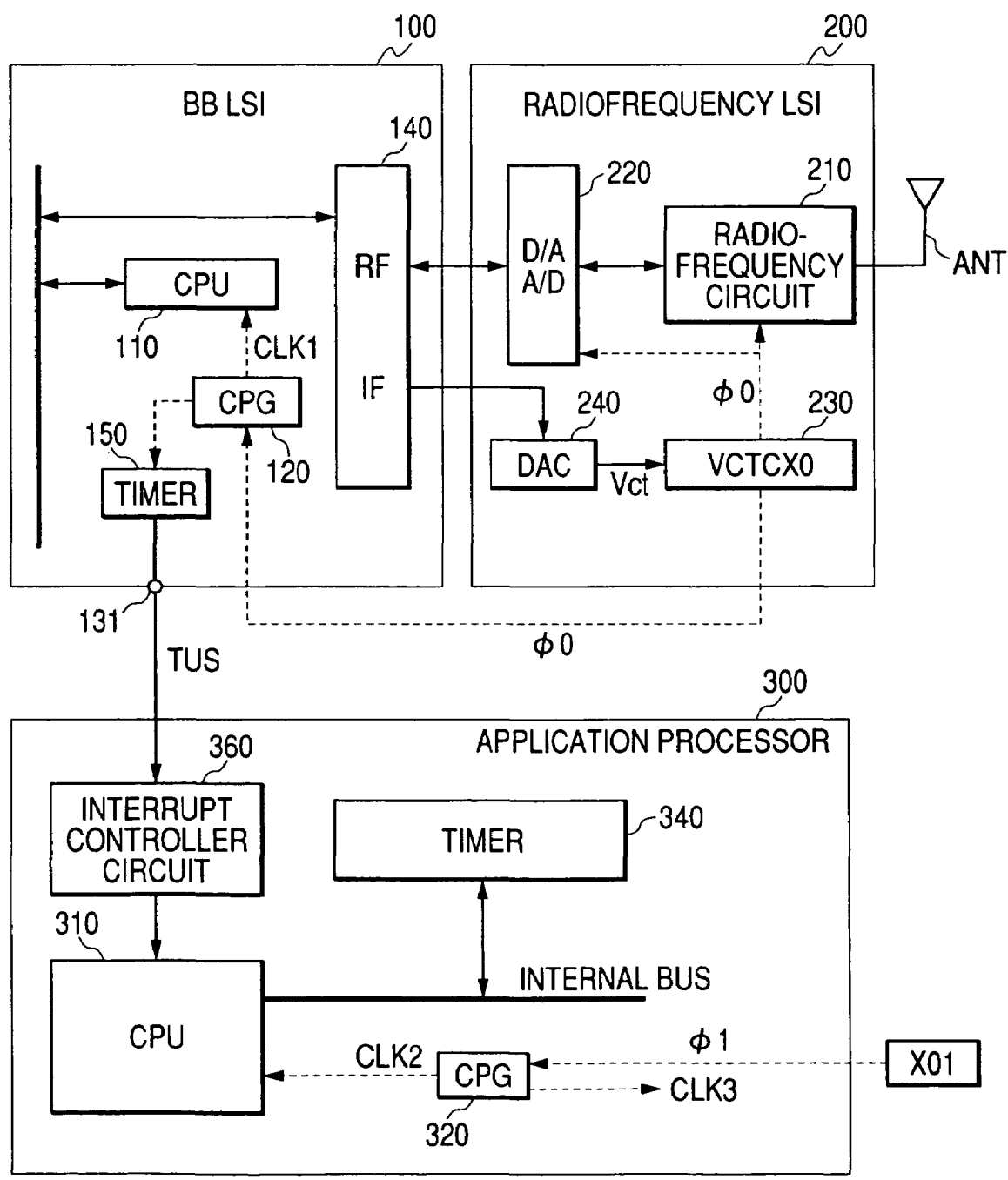
FIG. 2 is a block diagram showing a second embodiment in which the present invention is applied to a portable device, such as a portable phone, having a radio communication function.

FIG. 2 shows a second embodiment in which the present invention is applied to a portable device, such as a portable phone, having a radio communication function.

As in the first embodiment, a portable device of this embodiment has a baseband LSI 100 performing modulation and demodulation processing, a radiofrequency LSI 200 performing up-convert of a transmission signal and down-convert of a reception signal, and an application processor 300 compressing and decompressing voice data or moving image data. The relation between the baseband LSI 100 and the radiofrequency LSI 200 is the same as that of the first embodiment.

This embodiment is different from the first embodiment in that in place of the clock output terminal outputting a clock generated by the clock generator circuit 120 of the baseband LSI 100 to the outside, a timer 150 updated by a clock generated by a clock generator circuit 120 and a terminal 131 outputting to the outside a time-up signal TUS indicating that a predetermined time from the timer 150 elapses are provided in the baseband LSI 100, and that an interrupt controller circuit 360 is provided in the application processor 300, the time-up signal TUS from the timer 150 of the baseband LSI 100 is inputted as a timer interrupt signal to the interrupt controller circuit 360, and in the case that there is an timer interrupt to the interrupt controller circuit 360, the CPU 310 performs update operation of its own timer 340 in interrupt processing. The timer interrupt occurs in a cycle of e.g., 1 ms (millisecond).

The timer 150 may be a timer counter composed of hardware or may be a software timer configured in a RAM (memory circuit which is always readable and writable) update operated by a program. Since the CPU 110 executing the program is operated by a clock CLK1, the value of the timer 150 as a software timer is updated in synchronization with the clock CLK1. The timer 340 on the application processor 300 side may be also a timer counter or a software timer. The CPU 310 on the application processor 300 side is operated in synchronization with a clock CLK2. In the case that the timer 340 is a software timer, the timer 340 is updated in synchronization with the clock CLK2. However, the cycle (1 ms) of an interrupt from the baseband LSI 100 side is sufficiently longer than the cycle of the clock CLK2. Thus, the timer 340 can be regarded as being synchronized with the clock CLK1 on the baseband LSI 100 side.

The CPU 310 of the application processor 300 is operated by the internal clock CLK2 generated based on a clock signal φ1 of its own oscillator XO1 in the clock generator circuit 320 and can detect a difference between the clock CLK1 of the baseband LSI 100 and the clock CLK2 of the application processor 300 by referring to a value of the timer 340 update operated based on a timer interrupt from the baseband LSI 100. The processing operation on the application processor side, such as image data compression processing, can be synchronized with the processing operation on the baseband LSI 100 side.

As in the application processor 300, as the baseband LSI 100, an LSI having a configuration similar to that of a general-purpose microprocessor having a CPU and a RAM may be used. The baseband LSI 100 having such architecture may have an interrupt controller circuit and execute various processing by a timer interrupt. The baseband LSI 100 having such timer interrupt function is provided with a timer (counter) for a timer interrupt. The interrupt output of the timer is fed to the interrupt controller circuit 360 of the application processor 300. Accordingly, the function of this embodiment can be realized without increasing hardware very much.

Embodiment 3

Figure 3:
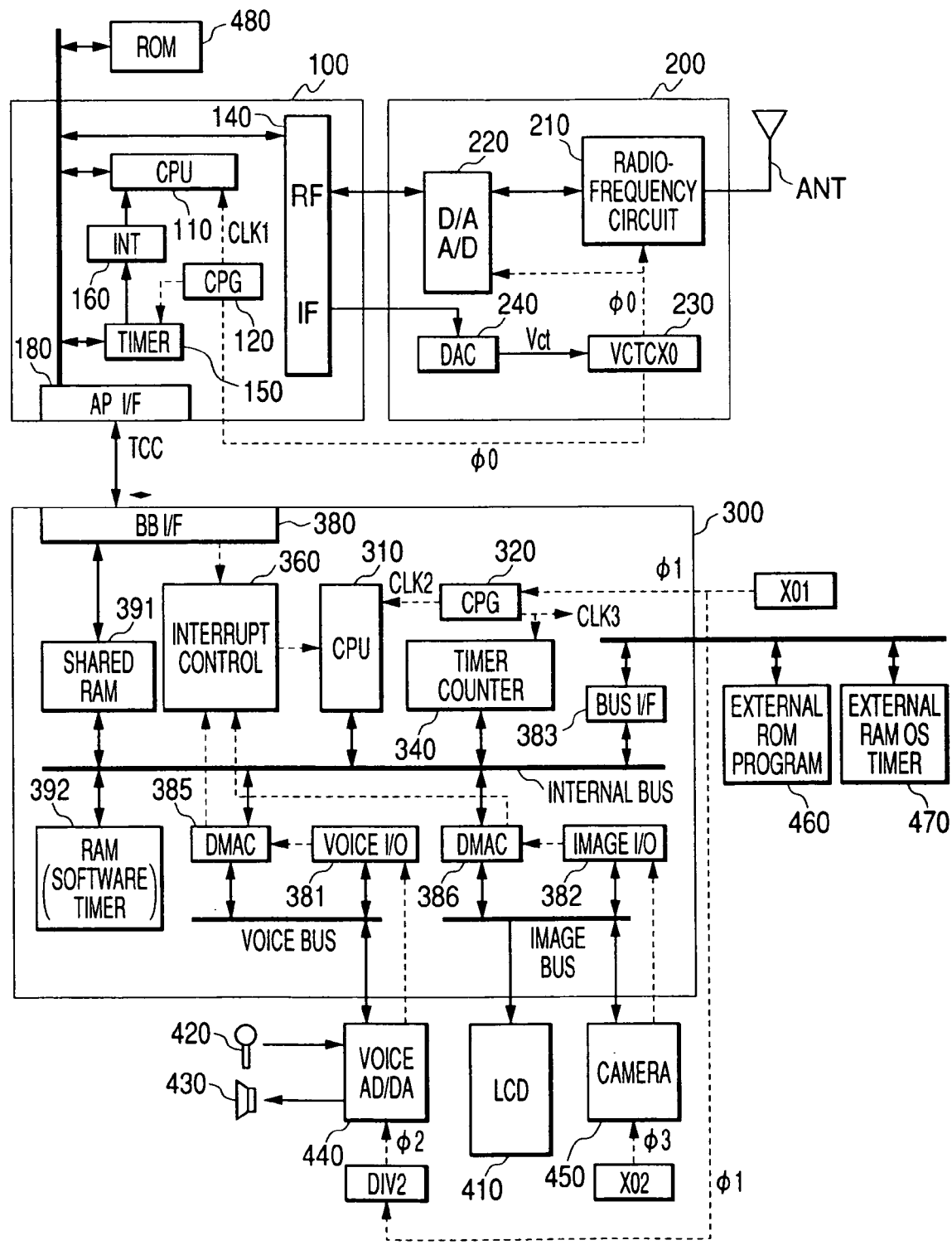
FIG. 3 is a block diagram showing a third embodiment in which the present invention is applied to a portable device, such as a portable phone, having a radio communication function.

FIG. 3 shows a third embodiment in which the present invention is applied to a portable device having a radio communication function. This embodiment is applied to a portable device, such as a portable phone, having a videophone function transmitting and receiving a still image or a moving image with voice.

As in the second embodiment, a portable device of this embodiment has a baseband LSI 100 performing modulation and demodulation processing, a radiofrequency LSI 200 performing up-convert of a transmission signal and down-convert of a reception signal, and an application processor 300 compressing and decompressing voice data or moving image data. The baseband LSI 100 is provided with a timer counter 150. The application processor 300 is provided with a timer counter 340 and an interrupt controller circuit 360. In the second embodiment, the timer counter 340 is update processed by an interrupt to the interrupt controller circuit 360. In this embodiment, the timer counter 340 is composed of hardware so as to be operated by an internal clock CLK2 generated based on a clock signal φ1 of its own oscillator XO1 in the clock generator circuit 320. In FIG. 3, circuits similar to or corresponding to those of FIG. 1 are indicated by the same reference numerals and the overlapped description is omitted.

In this embodiment, the application processor 300 is connected, as external devices, to a liquid crystal display device 410 as display means, a speaker 420 for voice output, a microphone 430 for voice input, an AD/DA converter circuit 440 performing DA conversion of an output signal to the speaker 420 and AD conversion of an input signal from the microphone 430, a solid-state imaging device (camera) 450 having a CCD (charge-coupled device) or a MOS sensor, an external ROM (read only memory) 460 having an OS (operation system) executed by the CPU 310 and a flash memory storing a user program, and an external RAM 470 having an SDRAM providing an area of an OS timer managed by the CPU 310 according to the OS.

The baseband LSI 100 is connected to an external ROM 480 storing a program executed by a CPU 110 of the baseband LSI 100 as an external device and is provided with an interrupt controller circuit 160 for executing timer interruption processing. The baseband LSI 100 may be also provided with an external RAM providing an area such an OS timer managed by the CPU 110 according to the OS.

Not being particularly limited, in this embodiment, the AD/DA converter circuit 440 is operated in synchronization with a clock signal φ2 obtained by frequency dividing a clock φ1 generated by the oscillator XO1 generating a reference clock of the application processor 300 by a divider circuit DIV2, and the solid-state imaging device (camera) 450 is operated in synchronization with a clock signal φ3 from an oscillator XO2 provided separately from the oscillator XO1 generating the reference clock φ1. The clock signal φ2 has a frequency of e.g., 8 kHZ. A voice signal from the microphone 430 is sampled for each 125 μs by the AD/DA converter circuit 440 to be converted to a digital signal.

The application processor 300 is provided with a voice interface 381 inputting and outputting a signal of the speaker 420 and the microphone 430 according to the external devices and an image interface 382 inputting an image signal from the solid-state imaging device 340. In this embodiment, in order to transmit and receive data between the baseband LSI 100 and the application processor 300, the baseband LSI 100 is provided with an interface 180 and the application processor 300 is provided with an interface 380.

Further, the application processor 300 of this embodiment is provided with a shared RAM 391 having two input-output ports and having a dual port memory accessible from both of the baseband LSI 100 and the application processor 300 as a buffer memory holding data transmitted and received between the baseband LSI and the application processor 300. The application processor 300 is provided with an internal RAM 392 providing a working area of the CPU 310 for temporarily storing operated data, a DMA controller 385 DMA transferring voice data between the internal RAM 392, the shared RAM 391 and the voice interface 381, a DMA controller 386 DMA transferring image data between the internal RAM 392, the shared RAM 391 and the image interface 382, and an external bus interface 383 for inputting and outputting data between the external ROM 460, the external RAM 470 and the application processor 300.

A method of synchronizing the baseband LSI 100 with the application processor 300 in this embodiment will be described.

Figure 4:
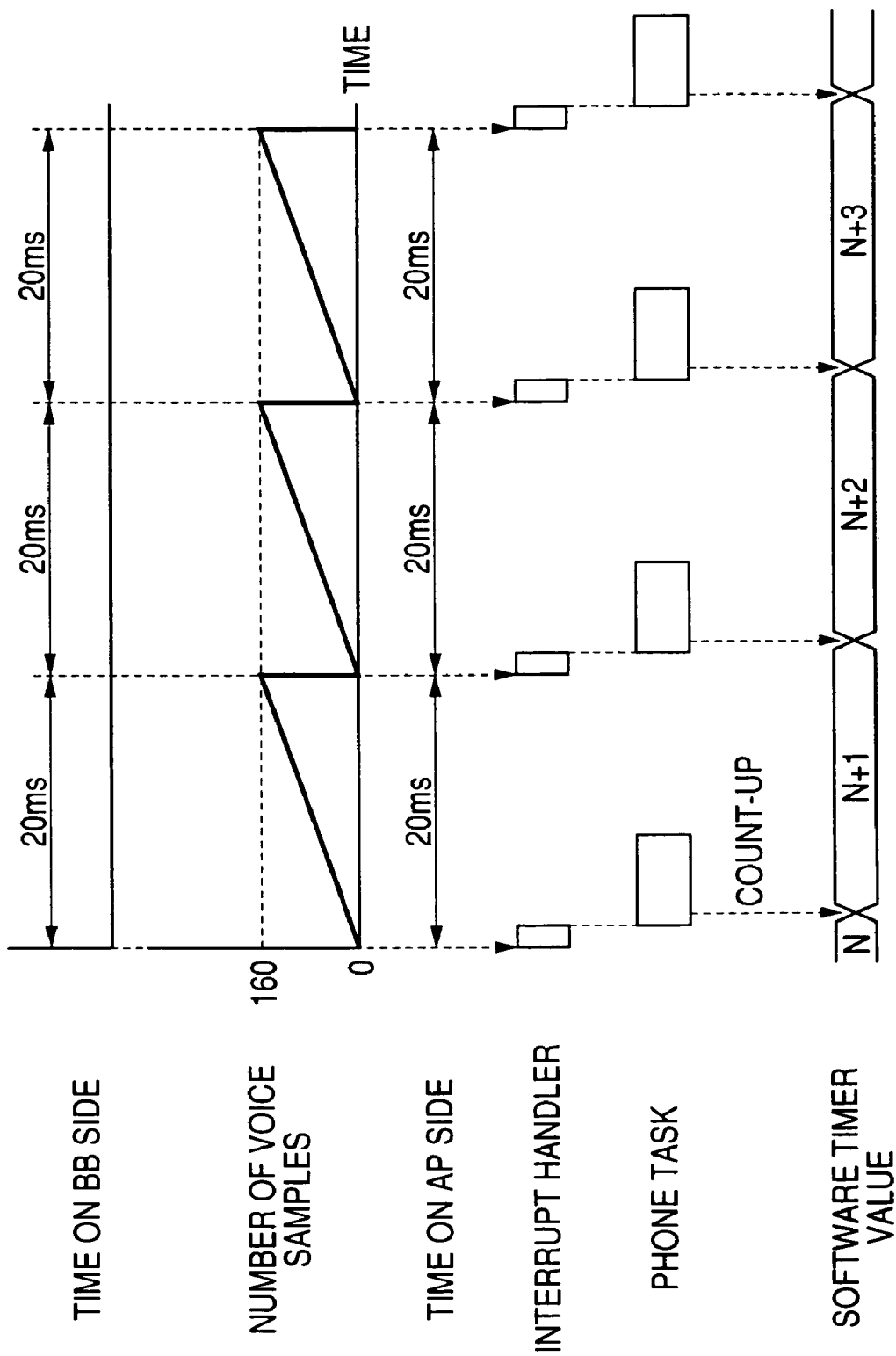
FIG. 4 is a timing chart showing the relation between time information on a baseband side stored in a shared RAM in the case that time on the baseband side is matched with time of the application processor, and time of a timer counter in the application processor and timing of various processing.
Figure 5:
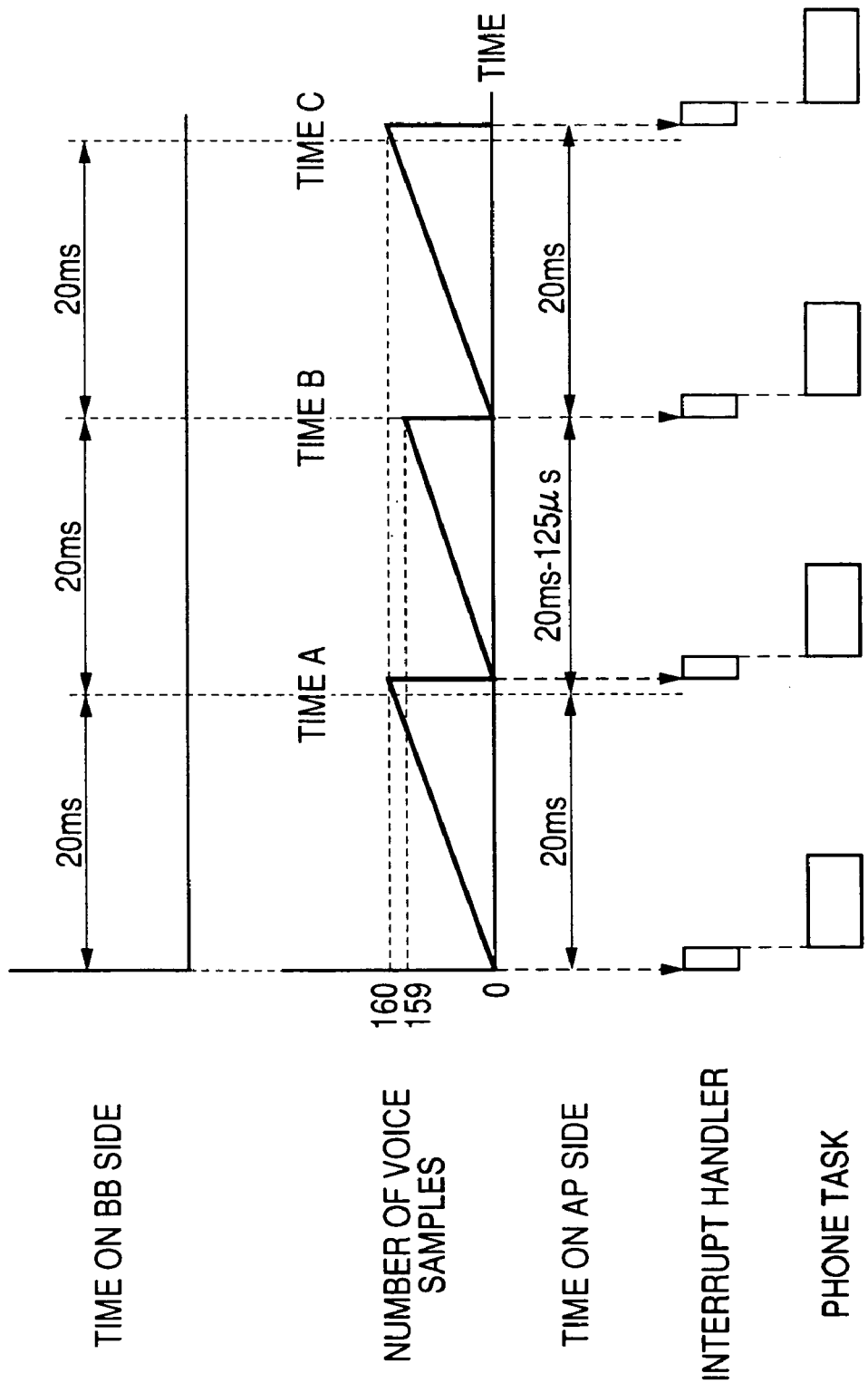
FIG. 5 is a timing chart showing the relation between time information on a baseband side stored in a shared RAM in the case that time on the baseband side is earlier than time of the application processor, and time of a timer counter in the application processor and timing of various processing.
Figure 6:
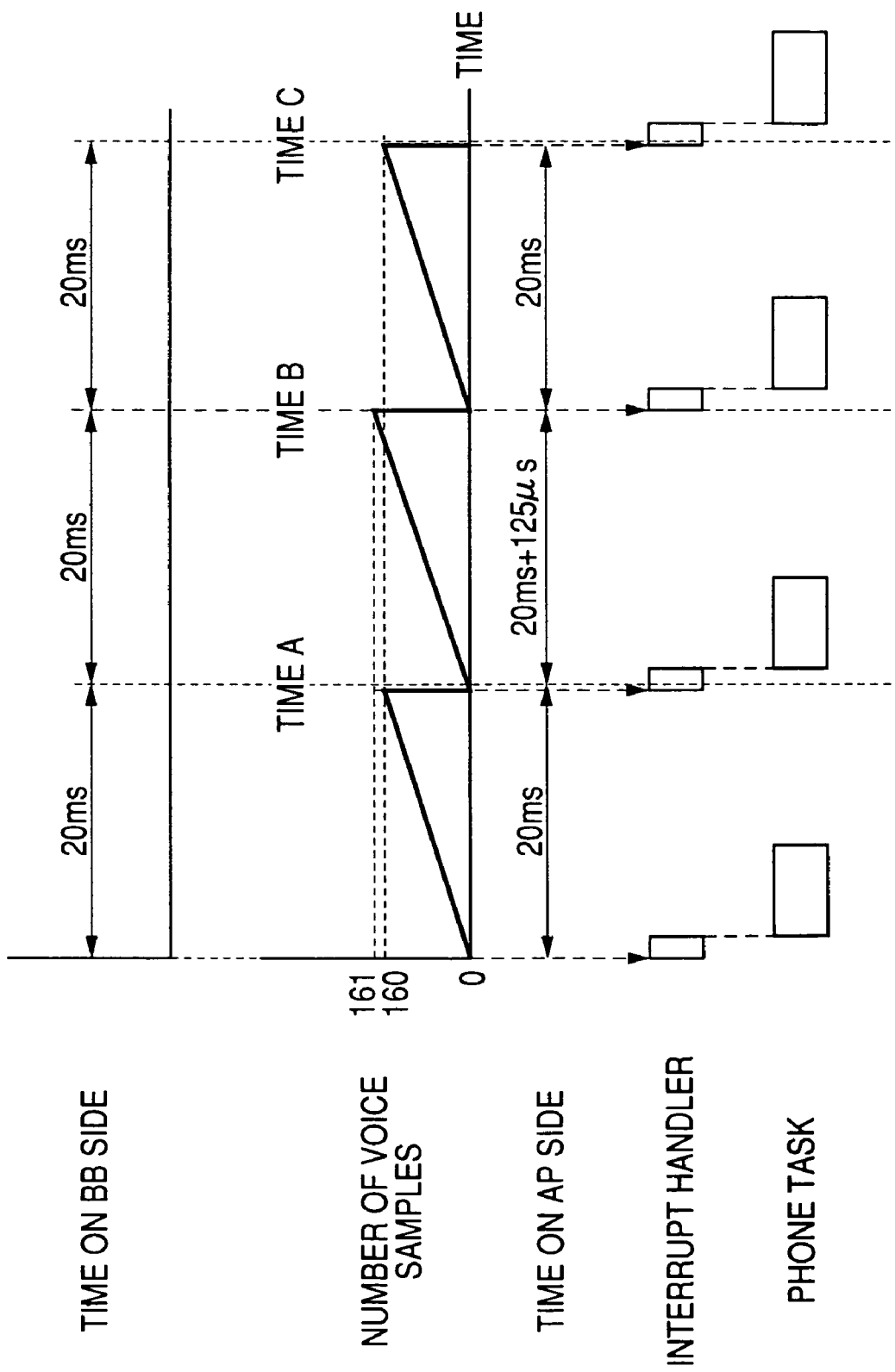
FIG. 6 is a timing chart showing the relation between time information on a baseband side stored in a shared RAM in the case that time on the baseband side is later than time of the application processor, and time of a timer counter in the application processor and timing of various processing.

In this embodiment, a value (text signal or binary code) TCC of the timer counter 150 is stored as time information on the baseband side from the baseband LSI 100 to the shared RAM 391 of the application processor 300. The time information on the baseband side stored in the shared RAM 391 may not be the value of the timer counter 150 and may be a value of the OS timer managed by the OS (operation system) executed by the CPU 110. Storing of the time information on the baseband side in the shared RAM 391 is desirably performed periodically, but need not be always performed periodically. FIGS. 4 to 6 show the relation between time information on the baseband side stored in the shared RAM 391, time of the timer counter 340 in the application processor 300 and timing of various processing, in which FIG. 4 shows the case that both times are almost matched, FIG. 5 shows the case that time on the baseband side is earlier, and FIG. 6 shows the case that time on the baseband side is later.

Figure 7:
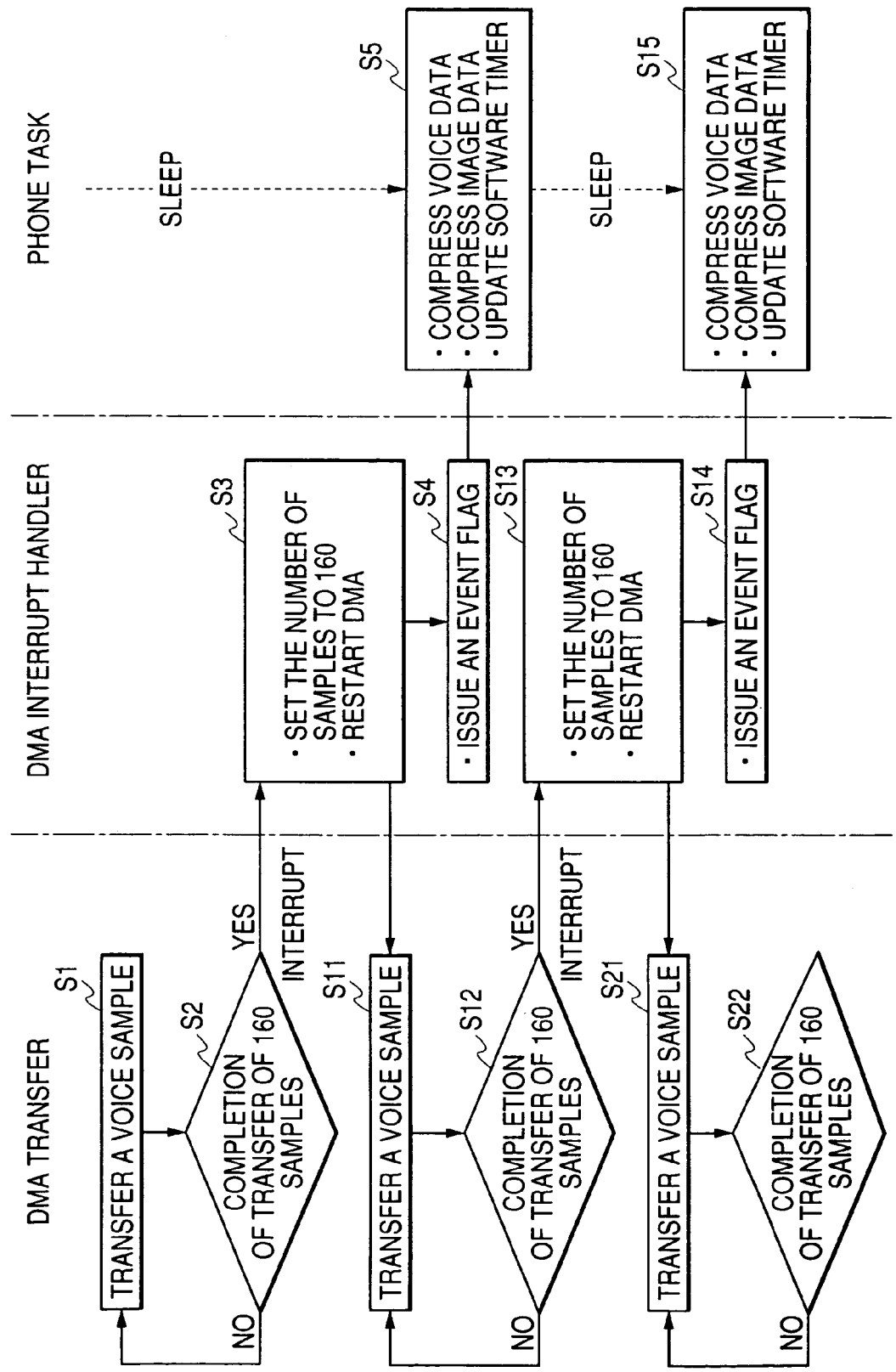
FIG. 7 is a flowchart schematically showing a procedure of voice data processing in the application processor.

FIG. 7 schematically shows a procedure of voice data processing in the application processor 300. A voice signal inputted from the microphone 430 is sampled for each 125 μs by the AD/DA converter circuit 440 to be converted to a digital signal. The converted voice data is transferred to the internal RAM 392 by the DMA controller 385 (step S1). The application processor 300 of this embodiment compresses each 160-voice data. The DMA controller 385 judges whether the number of voice data transferred to the internal RAM 392 is reached N (normally, 160) or not. When it is reached N, an interrupt signal is inputted from the DMA controller 385 to the interrupt controller circuit 360 to start an interrupt handler (step S2). Transfer of the voice data can be managed by the software timer in the internal RAM 392. In this case, when the number of voice data transferred reaches 160, a timer interrupt may be given to the interrupt controller circuit 360 by the software timer to start the interrupt handler. As described above, in this embodiment, since a voice signal is sampled for each 125 μs, an interrupt occurs for each 20 ms (=0.125 ms×160).

When an interrupt occurs, the interrupt handler sets the number of voice data transferred to N again to instruct start of data transfer to the DMA controller 385 (step S3). The DMA controller 385 starts DMA transfer of the voice data again. Thereafter, the interrupt handler issues an event flag on the program (step S4). When the event flag is issued, the CPU 310 starts phone task processing compressing the 160 voice data and image data in the internal RAM 392 and executes update of the software timer provided in the internal RAM 392 (step S5). The software timer is used for image data processing. The compressed voice data and image data are multiplexed to be stored in the shared RAM 391. The above operation is repeated, making it possible to transfer the compressed voice data and image data to the baseband LSI 100.

As is understood from FIG. 4, in the case that both times are almost matched with each other, 160 voice data are compressed for each 20 ms in the time on the baseband side to be multiplexed with the image data and stored in the shared RAM 391. There is no trouble in the case that the baseband LSI 100 reads voice data in the shared RAM 391 for each 20 ms. As shown in time A of FIG. 5, in the case that time on the baseband side is earlier, preparation cannot be done when the baseband LSI 100 reads data in the shared RAM 391 before completing compression of voice data on the application processor side. Here, transmission and reception of data to/from the baseband LSI should be done for each 20 ms. As shown in time A of FIG. 6, in the case that time on the baseband side is later and the delays are stacked to exceed 20 ms, the next data is stored before data stored in the shared RAM 391 is read from the baseband LSI 100 so that the buffer can be overflowed. The same thing can occur in image data.

Figure 8:
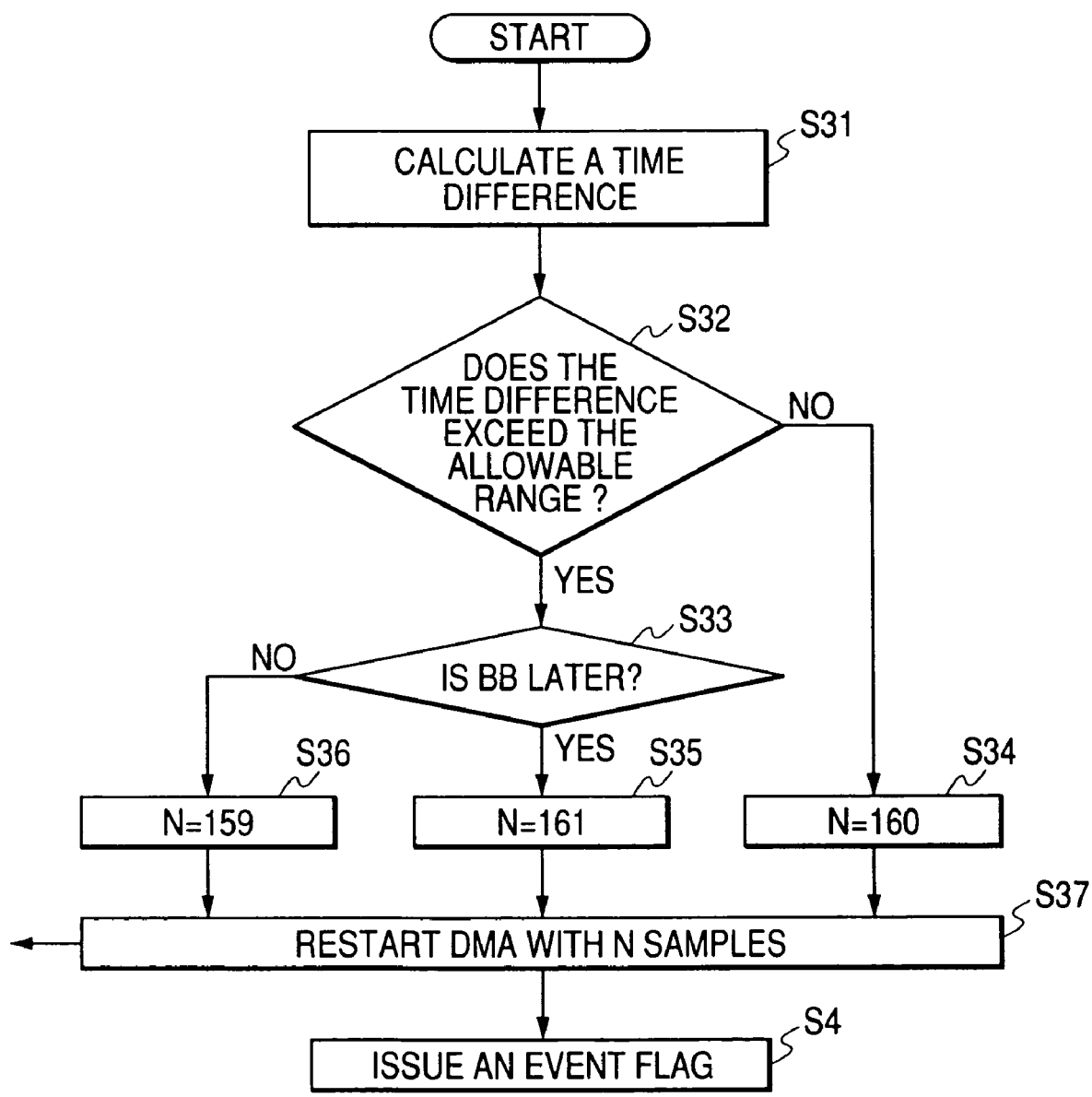
FIG. 8 is a flowchart showing a detailed procedure of processing by an interrupt handler in step S3 of the flowchart of FIG. 7.
Figure 9:
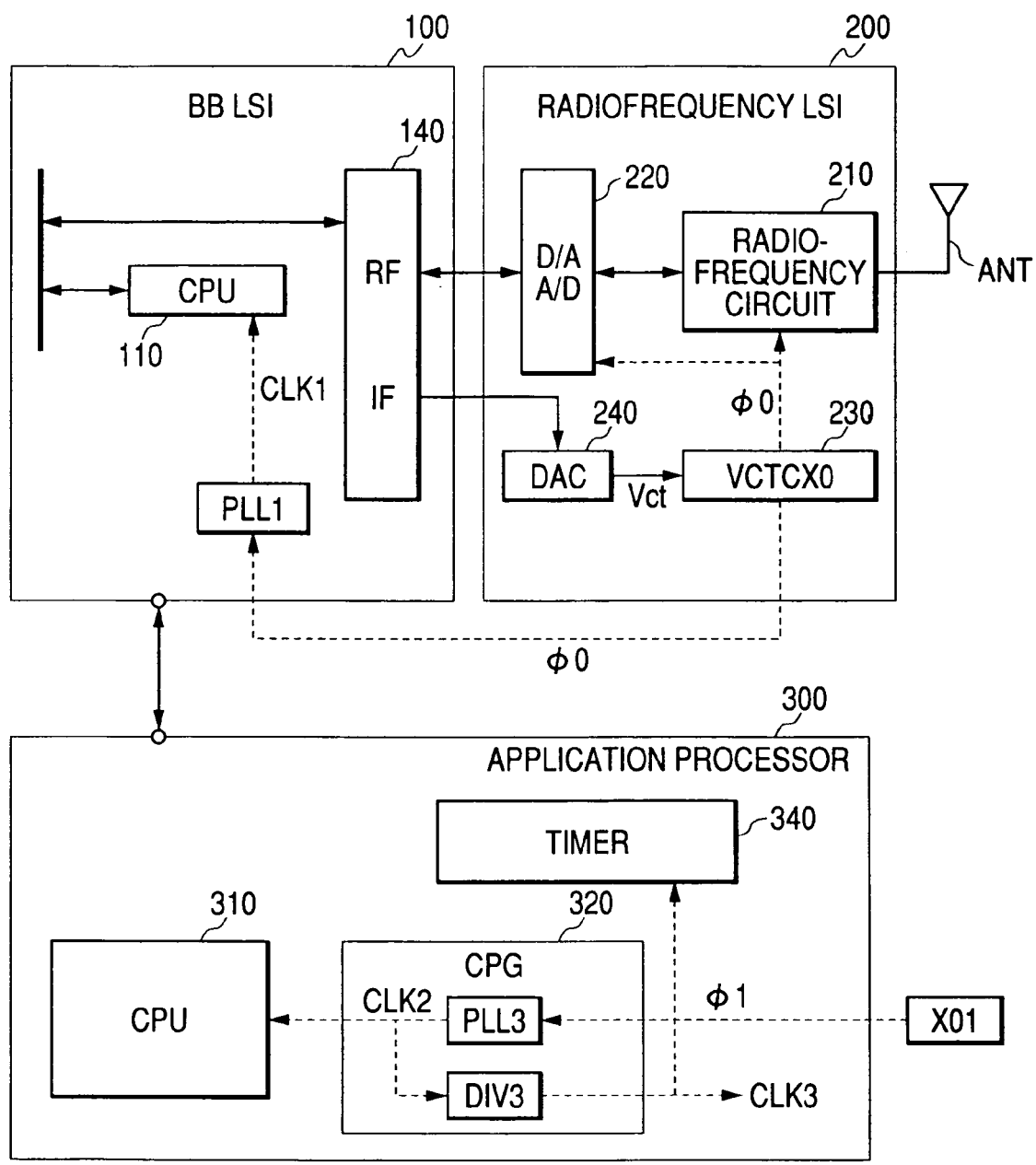
FIG. 9 is a block diagram showing a system configuration example of a prior art portable phone having a videophone function.

FIG. 8 shows a detailed procedure of processing by the interrupt handler in the step S3 of the flowchart of FIG. 7.

When the transfer of N voice data is completed to start the interrupt handler, the processing of FIG. 8 is started and the interrupt handler determines a difference between time on the baseband side in the shared RAM 391 and time on the application processor side (step S31). Whether the time difference exceeds the allowable range or not is judged, and in the case that it does not exceed the allowable range, the number of data transferred N is set to the normal "160" to instruct data transfer restart to the DMA controller (step S32→S34 and S37).

When judging that the time difference exceeds the allowable range, whether the time on the baseband side is later or not is judged in step S33, and when it is later, the number of data transferred N is set to "161" larger than the normal "160" to instruct data transfer restart to the DMA controller (step S33→S35 and S37). As shown in time B of FIG. 6, data transfer completion can be matched with reading timing of voice data in the shared RAM 391 by the baseband LSI 100. The CPU 310 discards one of 161 data transferred in the phone task processing to perform compression processing of 160 data. The correlation between voice data is relatively high. In the case that one data is discarded, lowering of voice quality is less.

When judging that the time difference exceeds the allowable range in step S32 and when judging that the time on the baseband side is earlier in step S33, the number of data transferred N is set to "159" smaller than the normal "160" to instruct data transfer restart to the DMA controller (step S33→S36 and S37). As shown in time B of FIG. 5, data transfer completion can be matched with reading timing of voice data in the shared RAM 391 by the baseband LSI 100. The CPU 310 uses the same data as the 159th data of 159 data transferred in the phone task processing as the 160th data to perform compression processing. The correlation between voice data is relatively high. In the case that the same data is used twice, lowering of voice quality is less.

Methods of determining a difference between time on the baseband side and time on the application processor side in step S31 of FIG. 8 are as follows.

A first method is a method of comparing time on the baseband side in the shared RAM 391 with a value of the timer counter 340 on the application processor side. A second method is a method of comparing time on the baseband side in the shared RAM 391 with a value of the software timer in the internal RAM 392 on the application processor side. A third method is a method of comparing time on the baseband side in the shared RAM 391 with a value of the OS timer in the external RAM 470 on the application processor side. Setting of the number of voice data transferred in steps S34 to S36 may be done by changing a value of the data transfer counter provided in the DMA controller 385. It may be also done by changing a value of the software timer in the internal RAM 392 or by changing the OS timer in the external RAM 470. In order to correct the time difference by changing the OS timer, a correction processing routine of the OS timer must be previously incorporated into the OS itself and be provided in a subroutine call function for calling the routine from the user program and executing it. Changing of the software timer in the internal RAM 392 can be corrected by the user program (application program) in the external memory 460 without correcting the OS timer.

In this embodiment, the interrupt handler compares the time information on the baseband side written into the shared RAM 391 by the baseband LSI 100 with the time on the application processor side (a value of the timer counter 340, the software timer, or the OS timer) to determine a time difference. When the time information on the baseband side is written into the shared RAM 391, a difference (time difference) between it and the time on the application processor side (a value of the timer counter 340, the software timer, or the OS timer) to store it in the internal RAM 392 or the external RAM 470. When the interrupt handler is started, the time difference is read from the internal RAM 392 or the external RAM 470 to perform judgment in step S32 of the flowchart of FIG. 8. Instead of writing the time difference into the internal RAM 392 or the external RAM 470, a pair of the time information on the baseband side and the time on the application side when it is written may be written into the internal RAM 392 or the external RAM 470.

The synchronization of the transfer and compression processing of voice data transmitted is described above. For the transfer and decompression processing of received voice data, in the same manner, the baseband LSI 100 can be synchronized with the application processor 300. For image data, the image processing software timer updated for each 20 ms in the RAM 392 is corrected based on the time information on the baseband side written into the shared RAM 391 by the baseband LSI 100 to synchronize the operation of the application processor side with the operation of the baseband LSI. The portable phone to which this embodiment is applied can maintain synchronization with the operation of a portable phone of the party on the other end over a long period of time via transmission and reception to/from the base station.

The invention which has been made by the present inventors is specifically described above based on the embodiments. The present invention is not limited to the above embodiments and various modifications can be made in the scope without departing from its purpose. For instance, in the above embodiments, a signal including time information on the baseband LSI side fed from the baseband LSI to the application processor is transferred via the external terminal or the interface. A transceiver circuit permitting transmission and reception by radio communication according to the Bluetooth standards may be provided in the interface part to transfer a signal including time information.

In the fourth embodiment of FIG. 4, the clock φ2 obtained by frequency dividing the clock φ1 of the oscillator XO1 by the divider DIV2 is a sampling clock of the AD/DA converter circuit 440. In a system using a clock of an exclusive oscillator provided separately from the oscillator XO1 as the sampling clock of the AD/DA converter circuit 440, the above embodiments can synchronize the baseband LSI with the application processor in the image data processing.

Mainly, the case that the invention which has been made by the present inventors is applied to a portable phone in an application field as its background is described above. The present invention is not limited to it and can be widely used in a portable device having a function of performing radio communication using a radio phone communication network such as a notebook PC or a PDA (Personal Digital Assistance).

What is claimed is:

1. A portable device comprising:
  a radio communication semiconductor integrated circuit which has a function of detecting a frequency drift of a clock signal based on time information for synchronization included in received data and is operated in synchronization with said clock signal to perform processing of modulating transmitted data and processing of demodulating the received data, said radio communication semiconductor integrated circuit comprising a terminal or an interface for outputting a signal including its own time information to the outside; and
  a data processing semiconductor integrated circuit which is operated in synchronization with a clock signal and performs compression processing of data to be transmitted and decompression processing of received data, said data processing semiconductor integrated circuit comprising a terminal or an interface for inputting a signal including time information from the outside;
  wherein the radio communication semiconductor integrated circuit and the data processing semiconductor integrated circuit are coupled so that said signal including time information is fed from said radio communication semiconductor integrated circuit via said terminal or interface to said data processing semiconductor integrated circuit 6,
  wherein said data processing semiconductor integrated circuit has a second timer, and synchronizes the data processing semiconductor integrated circuit with said radio communication semiconductor integrated circuit based on the time information of said second timer and said time information fed via said terminal or interface; and wherein said data processing semiconductor integrated circuit has a function of direct memory access (DMA) transferring sampled voice data or image data and based on a difference between said time information fed from said radio communication semiconductor integrated circuit to said data processing semiconductor integrated circuit and time information of said second timer, the number of said voice data or image data DMA transferred is set to synchronize time of said radio communication semiconductor integrated circuit with time of said data processing semiconductor integrated circuit.

2. The portable device according to claim 1, wherein when the number of said voice data or image data DMA transferred is larger than a predetermined number of data, the transferred last data is discarded, and when the number of said voice data or image data DMA transferred is smaller than the predetermined number of data, the transferred last data is used twice for matching with the predetermined number of data.

3. The portable device according to claim 2, wherein each time DMA transfer of said predetermined number of voice data or image data is completed, compression processing of the number of transferred data is performed and a predetermined software timer is updated.

4. The portable device according to claim 3, wherein said software timer is a timer managed by an operating system, and said operating system has a function of correcting said software timer.

* * * * *